(12) United States Patent
Saigal et al.

(10) Patent No.: US 6,426,282 B1
(45) Date of Patent: Jul. 30, 2002

(54) METHOD OF FORMING SOLDER BUMPS ON A SEMICONDUCTOR WAFER

(75) Inventors: Dinesh Saigal, San Jose; Shankarram Athreya, Sunnyvale; Kenny King-Tai Ngan, Fremont; Lisa L. Yang, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/565,569

(22) Filed: May 4, 2000

(51) Int. Cl.[7] .............................................. H01L 21/44
(52) U.S. Cl. ........................................ 438/613; 438/653
(58) Field of Search .............................. 438/106, 113, 438/613, 614, 639, 653, 710, 14, 17, 107; 257/676, 766, 770, 776, 748, 779

(56) References Cited

U.S. PATENT DOCUMENTS

| | | | |
|---|---|---|---|
| 5,587,336 A | * 12/1996 | Wang et al. ................ 438/17 |
| 5,904,555 A | * 5/1999 | Darbha et al. .............. 438/613 |
| 5,937,320 A | * 8/1999 | Andricacos et al. ......... 438/614 |
| 6,011,313 A | 1/2000 | Shangguan et al. ......... 257/778 |
| 6,015,083 A | 1/2000 | Hayes et al. ................ 228/254 |
| 6,140,703 A | * 10/2000 | Cronin et al. ............... 257/766 |
| 6,146,996 A | * 11/2000 | Sengupta ..................... 438/639 |

FOREIGN PATENT DOCUMENTS

| | | | |
|---|---|---|---|
| WO | WO 98/54377 | 12/1998 | ........... C23C/14/14 |
| WO | WO 99/34423 | 7/1999 | ........... H01L/21/31 |
| WO | WO 99/57753 | 11/1999 | ........... H01L/21/00 |

* cited by examiner

*Primary Examiner*—David Nelms
*Assistant Examiner*—Phuc T. Dang
(74) *Attorney, Agent, or Firm*—Moser, Patterson & Sheridan LLP

(57) ABSTRACT

A method of forming solder bumps on a semiconductor wafer utilizing a low temperature biasable electrostatic chuck. In particular, the method comprises the steps of providing at least one bond pad on the semiconductor wafer, forming a barrier layer over the bond pad, and forming the solder bumps upon the at least one bond pad. By controlling the temperature and biasing of the electrostatic chuck, the barrier layer, such as nickel vanadium, exhibits a low tensile or compressive stress.

25 Claims, 5 Drawing Sheets

Cross section of C4 solder bump

Cross section of C4 solder bump

400A Ti/3700NiV Stack

| Temperature (°C) | Bias (W) | Stress (MPa) |
|---|---|---|
| Room | 500 | 286 |
| 200 | 500 | 753 |
| 150 | 50 | 1060 |
| 150 | 250 | 358 |
| 150 | 450 | -110 |

METHOD OF FORMING SOLDER BUMPS ON A SEMICONDUCTOR WAFER

BACKGROUND OF THE INVENTION

1. Field of the Invention

The invention relates generally to processing a substrate, e.g., a semiconductor wafer. In particular, the invention relates to a method and apparatus for depositing solder bumps on a semiconductor wafer.

2. Description of the Background Art

Microelectronic semiconductor substrates on which integrated circuits are formed require electrical contacts to provide the necessary interface between the integrated circuit and other electronic devices, such as printed circuit boards or user interface devices such as a monitor, keyboard, printer, mouse, or the like. With continuing advances in the semiconductor industry, circuits are often designed to use as little space as possible. Miniaturization of electrical circuits leads to many advantages including improved speed, noise reduction, and cost reduction. Despite increasing emphasis on miniaturization, reliable circuit interconnections must be formed on the semiconductor substrates.

Several methods may be used for forming the necessary electrical interconnections on semiconductor substrates. One method is to utilize lead frames that extend out of a plastic package in which a semiconductor device has been molded in order to connect with an external device. With increasing miniaturization, however, another approach known as "flip-chip" technology has widely come into practice. With "flip-chip" technology, electrical interconnects are provided by means of conductive metal bumps, known as solder bumps, constructed on bond pads that are formed on the top or active surface of the semiconductor substrate. The semiconductor substrate can then be "flipped" and mounted directly to a printed wiring board or other device, with the solder bumps forming the electronic interconnects. "Flip-chip" technology thus eliminates the need for semiconductor packaging, and also leads to many important advantages over other technologies used to form electrical interconnects including greater miniaturization, better interconnect reliability, higher circuit densities, and cost savings.

Vias are often utilized with integrated circuits (IC) to provide the interconnection necessary between the internal circuitry of the IC and the external interface, i.e., circuitry printed wiring boards and the like. Typically, a layered metallization using conventional metal deposition processes is utilized for the via bond pad, upon which a metal solder bump is constructed. A device is subsequently bonded to the substrate through the solder bump.

A semiconductor substrate typically undergoes a number of processing steps prior to the solder bump formation processing sequence. The process includes applying an adhesive and a diffusion barrier, such as titanium (Ti) and nickel vanadium (NiV) respectively over the via bond pad. The solder is then applied over the diffusion barrier and subjected to heating in order to create a reflow of the solder over the via bond pad.

The Ti/NiV layers (i.e., stack), usually deposits under a high tensile stress. Accordingly, stress control is extremely important during illustratively, a controlled collapse chip connection ("C4") flip chip process. The C4 flip chip process is an example of solder bump based flip chip technology known in the art. Tensile stress has been found to contribute to many failure mechanisms such as delamination, deformation, and fracture. Thus, it is desirable to keep the stress level at low tensile, or preferably in the compressive range to prevent the above mentioned failure mechanisms. Additionally, it has been found that stress is strongly dependent on deposition temperature and wafer bias. Therefore, there is a need to have the ability to integrate the NiV deposition process with sputtering hardware that is capable of providing active wafer temperature control, wafer bias, and full coverage.

SUMMARY OF THE INVENTION

A method for providing active wafer temperature control, wafer bias and full wafer coverage overcomes the disadvantages heretofore associated with the prior art. Specifically, the inventive method advantageously forms solder bumps on a semiconductor wafer utilizing a low temperature biasable electrostatic chuck. In particular, the method comprises the steps of providing at least one bond pad on the semiconductor wafer and depositing a barrier layer such as nickel vanadium over the at least one bond pad. Solder is then deposited over the barrier layer to form a solder bump on the bond pad.

Thus, by selecting an operating temperature and biasing power of the electrostatic chuck, the tensile stress or compressive strength of the barrier layer may be controlled. In this manner, the stress level of the titanium and nickel vanadium layers are maintained at low tensile, or preferably in the compressive range to prevent solder joint failures.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The purpose of this invention is to provide a method of low stress sputtering of deposition materials on a semiconductor wafer. Specifically, solder connections on leadless flip chips require adhesive and barrier layers deposited upon a bonding pad prior to depositing solder and forming solder bumps thereafter. The method inventively utilizes a low temperature biasable electrostatic chuck to establish a favorable set of process conditions to deposit such layers at an acceptable stress level.

Figure 1:
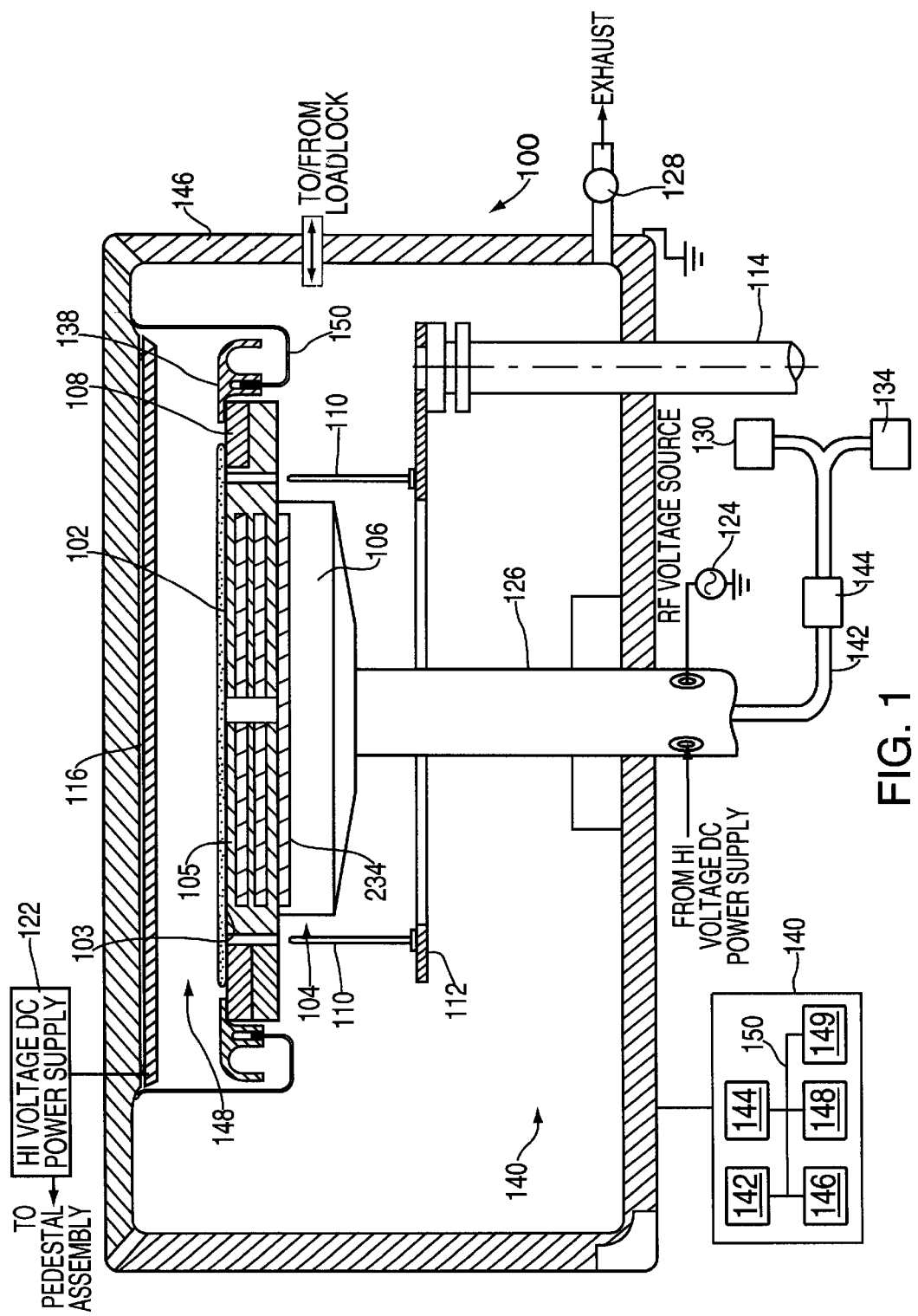
FIG. 1 depicts a partial cross-sectional view of a semiconductor wafer processing chamber for practicing the present invention.

FIG. 1 depicts a cross-sectional view of a physical vapor deposition (PVD) processing chamber 100 for processing a workpiece 102, i.e., a semiconductor wafer in a workpiece processing system (not shown). For a detailed understanding of the PVD processing chamber 100 and its operation in processing a wafer, the reader should refer to the drawings and the detailed description contained in commonly assigned U.S. Pat. No. 5,228,501, issued Jul. 20, 1993 incorporated herein by reference. That disclosure discloses a wafer support assembly used in a physical vapor deposition chamber manufactured by Applied Materials, Inc. of Santa Clara, Calif. Furthermore, the chamber may be integrated in a processing system or cluster tool such as an ENDURA™ platform, also manufactured by Applied Materials, Inc.

Specifically, the wafer 102 is disposed on a support surface 103 of a pedestal assembly 104 for retaining the wafer, regulating wafer temperature, and providing RF biasing to the wafer in a well-defined and insulated path that is internal to the apparatus. The pedestal assembly 104 has a puck 105, i.e., an electrostatic chuck, supported by a pedestal base 106 and a shaft 126 which contains the necessary wiring to conduct DC and RF power from remote power sources 122 and 124 to the pedestal assembly 104. Additionally, the shaft 126 carries a gas conduit 142 to feed backside cooling gas through the pedestal assembly 104 and to a backside of the wafer 102. Lift pins 110 mounted on a platform 112 connected to a vertical shaft 114 serve to lift the wafer 102 off the support surface 103 after processing.

A target 116 of sputtering or deposition material is positioned over the pedestal assembly 104. Typically, the target 116 is nickel vanadium (NiV), and is electrically insulated from the chamber 100. In a preferred embodiment the target material is 93% nickel and 7% vanadium (by weight), although other weighting percentages may be used. The remote power source 122 is preferably a high voltage DC power supply, and is electrically connected between the target 116 and pedestal assembly 104 for magnetron sputtering a wafer. Additionally, an RF (radio frequency) voltage source 124 is coupled to the pedestal assembly 104 as explained in greater detail below. Waste ring 108, cover ring 138 and shield 150 circumscribe the pedestal assembly 104 to prevent unwanted deposition into the lower chamber region 140.

Figure 2:
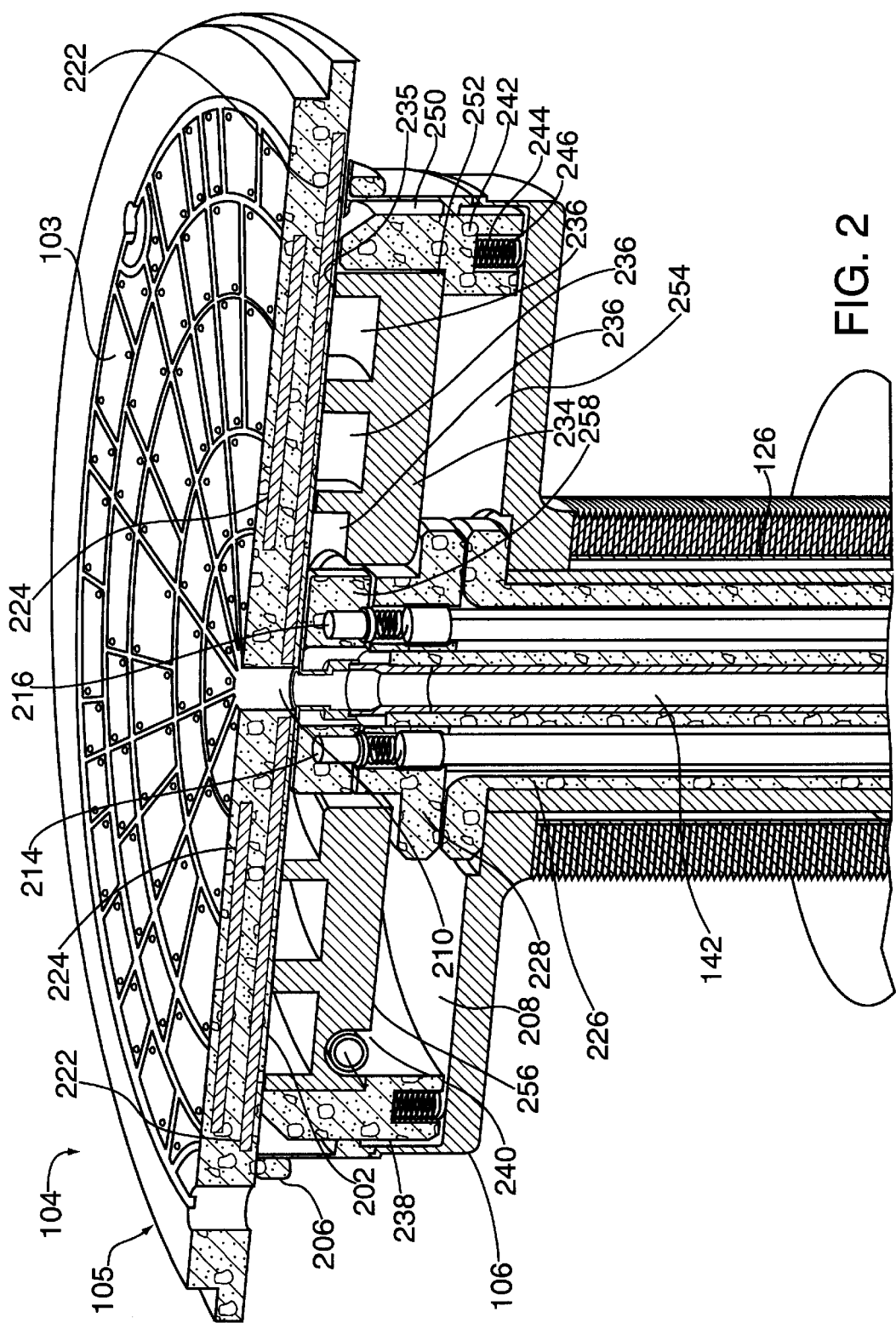
FIG. 2 depicts a cross-sectional view of a low temperature biasable electrostatic chuck seen in the wafer processing chamber in FIG. 1.

FIG. 2 depicts a cross-sectional view of a specific puck 105, i.e., a low temperature biasable electrostatic chuck. Specifically, the pedestal assembly 104 has an electrostatic chuck 105 disposed on top of the pedestal base 106. The pedestal base 106 is usually fabricated from a durable material, e.g., nickel, an alloy, or a similar metallic material. In a preferred embodiment of the invention, the pedestal base is KOVAR®. KOVAR® is the trade name for an iron/nickel/cobalt alloy manufactured and sold by Westinghouse Electric Co. The electrostatic chuck 105 can be fabricated from a dielectric material e.g., a ceramic, silicon oxide, silicon nitride, sapphire, or the like and is shaped as a thin circular puck. The chuck 105 is attached to the pedestal base 106 via a retaining ring 206. An example of a pedestal assembly 104 that may be used in this apparatus is disclosed in commonly assigned U.S. patent application Ser. No. 09/071,784 filed May 1, 1998 to Flanigan et al and is incorporated by reference herein. Specifically, that reference discloses a low temperature biasable electrostatic chuck.

Within the body of the electrostatic chuck 105 there are various conducting elements that assist in workpiece processing. For example, a heater electrode 222 may be buried within layers of the electrostatic chuck 105. The heater electrode 222 is connected to a remote power source (not shown). In this way, the heater electrode 222 generates heat, which is transferred to the workpiece on top of the electrostatic chuck 105 to maintain the workpiece at proper processing temperatures. Additionally, the electrostatic chuck 105 may be provided with one or more chucking electrodes 224. The chucking electrodes 224 are also connected to a remote power source, i.e. the high voltage DC power supply 122 of FIG. 1. In this way, the chucking electrodes 224 provide the necessary electrostatic force to the backside of a workpiece to retain it on the electrostatic chuck 105. The chucking electrodes 224 are shown in a bipolar configuration, but other configurations such as monopolar or zoned are possible.

The enclosure 208 contains further components that assist in biasing of the workpiece (wafer) 102 and temperature control of the workpiece retained upon the electrostatic chuck 105. An electrode 234 is disposed between the electrostatic chuck 105 and the pedestal 104. Specifically, the electrode 234 is disposed directly below the electrostatic chuck 105 inside the enclosure 208. Preferably, the electrode 234 is fabricated from a material that is a high conductor of RF power. In a preferred embodiment of the invention, the electrode is a cooling manifold fabricated of a block of copper or stainless steel that is machined to communicate with other enclosure components. The cooling manifold\electrode 234 has a top surface 235. The top surface may have a plurality of grooves 236. The grooves 236 reduce the surface area of the top surface 235 of the cooling manifold\electrode 234 that is in contact with the electrostatic chuck 105 such that the amount of heat extracted from the chuck (and wafer) is moderated.

A coolant tube 238 is disposed in a channel 240 on a bottom 256 of the plate 234. The coolant tube 238 circumscribes nearly the entire bottom 256 of the cooling manifold\electrode 234 and extends down the shaft 126 within a bellows isolator 226. In a preferred embodiment of the invention, the coolant tube 238 is fashioned from a RF conductive material such as stainless steel. Additionally, the coolant tube 238 may have a plurality of coatings or platings to improve RF conductivity and prevent oxidation of the coolant tube 238 and previously deposited coatings. The coolant tube 238 is affixed to the channel 240 by any means known to establish and maintain physical contact between the coolant tube 238 and the plate 234.

The cooling manifold\electrode 234 is maintained in close physical contact with the bottom 202 of the electrostatic chuck 105 via mechanically biased insulator 242. The insulator 242 is preferably an isolator ring fabricated from a dielectric material, e.g., ceramic, and circumscribes the upper inner wall 250. Specifically, the springs 246 in recesses 244 bear upon the floor 254 of the enclosure 208 and the isolator ring 242. The resultant forces from the springs 246 maintain the cooling manifold 234 in close physical contact with the bottom 202 of the electrostatic chuck 105.

In operation, a wafer 102 is placed on the support surface 103 of the electrostatic chuck 105. Air is drawn out of the chamber 100 via a vacuum pump 128 to create a low-pressure environment (i.e. 1 mT–5 Torr). A reactant gas, preferably Argon, is introduced into the chamber 100 from one of the remote gas sources 130 or 134. The power supply 122 is energized, which electrostatically clamps the wafer 102 to the support surface 103. Specifically, a DC bias is applied to the chucking electrodes 224 via capacitive coupling using a 13.56 MHz bias power supply 122. The high voltage level produced by the power supply 122 also ignites the gas into plasma and biases the target 116. Once the plasma is formed, the gaseous ions cause the target material to sputter onto the wafer 102. Furthermore, the cooling manifold\electrode 234 and the RF biasing of the substrate pedestal 104 may be controlled to actively regulate the temperature and RF biasing via a controller (not shown). In this manner, the chamber is capable of controlling specific stress levels during the NiV deposition process as required.

Figures 3, 5:
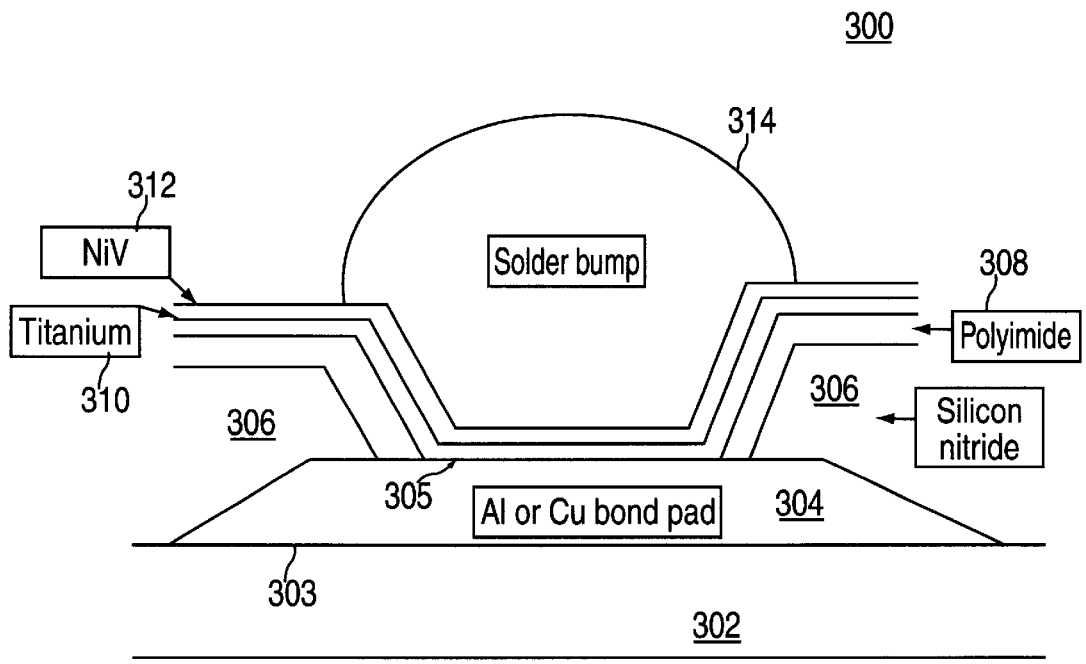
FIG. 3 depicts a cross-sectional view of a controlled collapse chip connection solder bump.
FIG. 5 depicts a table of various stress levels (MPa) for a 400A Ti/3700A NiV stack as derived from FIG. 4.

FIG. 3 depicts a cross-sectional view of a controlled collapse chip connection solder bump 300. The controlled collapse chip connection solder bump 300 is formed upon a silicon wafer 302 having a surface 303 that is metallized with a bonding plate layer (i.e., pad) 304 of aluminum or copper. Disposed over the bonding pad 304 are one or more insulative layers (e.g., silicon nitride 306 and polyimide 308). The silicon nitride 306 and polyimide is then etched by conventional etching techniques (e.g., hardmask or photolithographic techniques) to form a channel 305 over the pad 304 such that an upper surface of the metallic bonding pad 304 is exposed.

Furthermore, an adhesion layer such as Titanium is deposited in the channel 305, on the exposed portion of the bonding pad 304 and the insulative layers to provide adequate adhesion for a barrier layer 312. The barrier layer 312 is then deposited in the channel 305 and on the adhesion layer 310 prior to making a die-substrate solder connection. The barrier layer 312 serves as a diffusion barrier against a solder bump metal 314 and the bonding pad 304. Preferably, the barrier layer 312 is a conductive material that is highly resistant to diffusion, and in one embodiment of the invention is nickel vanadium (NiV). The layers of Ti and NiV together form a stack typically measuring 400 Angstroms and 3700 Angstroms respectively. After the Ti/NiV film deposition, the wafer 302 is subject to a photolithograph process to expose only the channel 305 with the adhesive layer 310 and barrier layer 312. Solder electroplating is then performed by conventional electroplating techniques, which allows solder to electroplate only the channels 305. The solder may be a standard lead/tin composite. The Ti/NiV film is then etched out by conventional etching techniques from the non plated areas wherein the plated solder bump 314 acts as a mask against etching of the Ti/NiV stack in the bonding pad 304 areas. Finally, the wafer 302 is subjected to heat in order to reflow the solder, thereby causing the deposited solder to take the desired shape of solder bumps 314.

Figure 4:
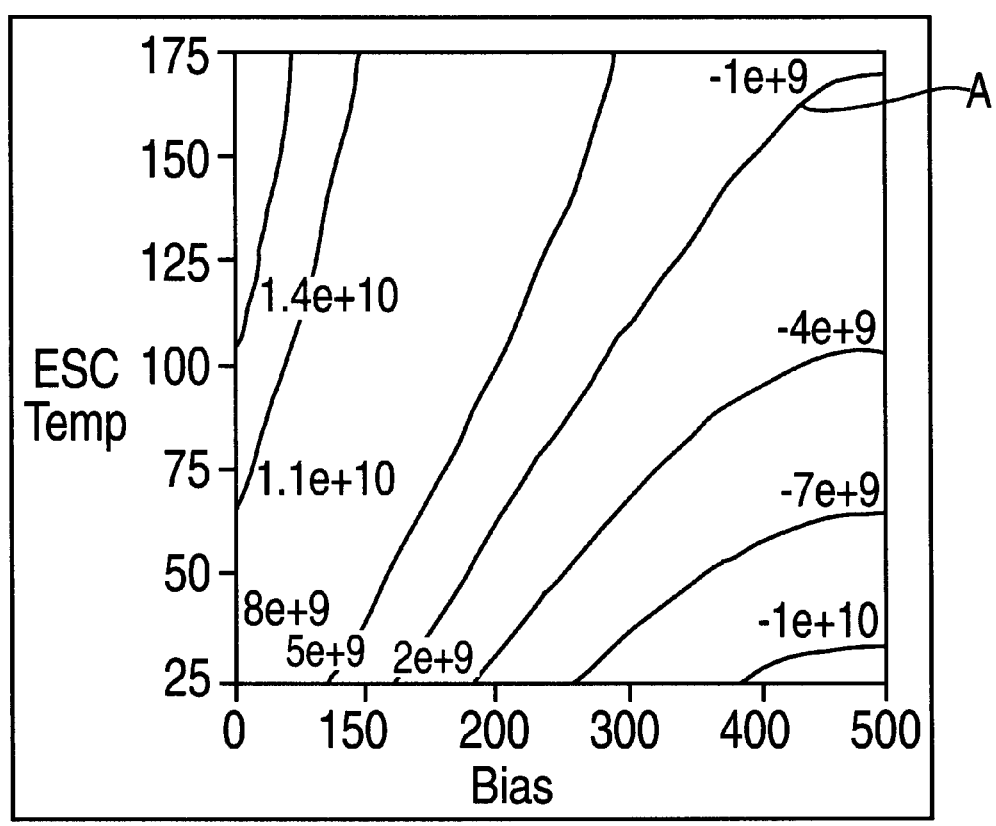
FIG. 4 depicts a graph plotting stress of deposited NiV films as a function of temperature and bias power.

FIG. 4 depicts a graph plotting NiV film stress. Specifically, temperature of the electrostatic chuck is shown increasing along the ordinate axis, and bias power (in Watts) of the electrostatic chuck is shown increasing along the abscissa axis. The curves represent NiV films of various stress levels. It is believed that wafer bias controls the energy of ions bombarding the growing film and can switch the stress from tensile to compressive by an "atomic peening" mechanism. Wafer temperature determines the atomic mobility of atoms on the surface, which can influence residual stress. For example, a film "A" having a stress level of $-1e^{+9}$ dynes may be formed at any combination of temperature and biasing along the film line. FIG. 5 depicts a table of various stress levels (MPa) for a 400A Ti/3700A NiV stack as derived from the graph of FIG. 4. Accordingly, FIGS. 4 and 5 illustrate that low wafer temperature along with a relative high wafer bias can achieve the required stress level in the range of +100 MPa to −500 MPa to create a film with the desired stress value. The electrostatic chuck is operated at a temperature in a range of 25° C. to 200° C., and preferably at 75° C. Similarly, the electrostatic chuck is operated at a biasing power level of 50 Watts to 800 Watts, and preferably at 350 Watts.

Figure 6:
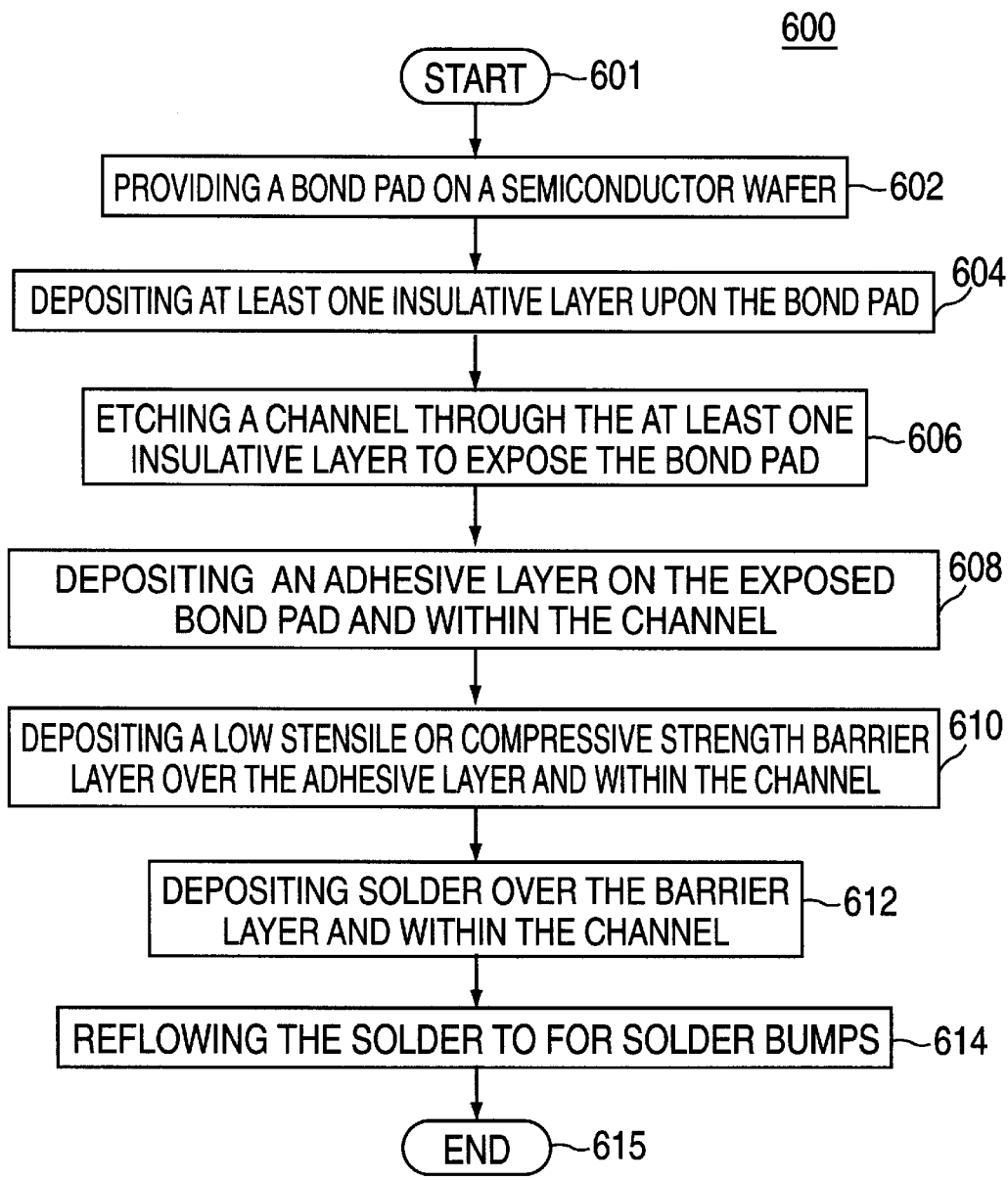
FIG. 6 depicts a series of method steps for practicing the invention.

FIG. 6 depicts a flow chart of a series of steps for practicing the method of the subject invention using a low-temperature biasable electrostatic chuck such as the one described in chamber 100. Specifically, the method 600 begins at step 601 and proceeds to step 602 where at least one bond pad is provided on a semiconductor wafer. In step 604, at least one insulative layers is deposited upon the at least one bond pad. In a preferred embodiment, first silicon nitride and then a polyimide insulative material is deposited over the bond pad, and the method proceeds to step 606. In step 606, the wafer is etched such that a channel is created through the insulative layers and exposes the bond pad. In step 608, an adhesive layer, such as titanium, is deposited over the exposed bond pad and within the channel. In step 610, a low tensile or compressive strength barrier layer, such as nickel vanadium, is deposited over the adhesive layer and within the channel. In step 612, solder is deposited under low-temperature, RF biased conditions over the barrier and within the channel, and in step 614, the solder is reflowed to create solder bumps. The method 600 ends in step 615. Thus, method 600 provides solder bumps that are not subject to high tensile stresses from the barrier layer. Accordingly, solder joint failures are diminished.

The above-described process steps, as illustrated in FIG. 6 are advantageously performed in a system that is controlled by a processor-based control unit. FIG. 1 shows a block diagram of a deposition system 100 having a control unit 140 that can be employed in such a capacity. The control unit 140 includes a processor unit 142, a memory 144, a mass storage device 146, an input control unit 148, and a display unit 149 which are all coupled to a control unit bus 150.

The processor unit 142 forms a general purpose computer that becomes a specific purpose computer when executing programs such as a program for implementing deposition of the present invention. Although the invention is described herein as being implemented in software and executed upon a general purpose computer, those skilled in the art will realize that the method of the present invention could be operated using hardware such as an application specific integrated circuit (ASIC) or other hardware circuitry. As such, the invention should be understood as being able to be implemented, in whole or in part, in software, hardware, or both.

The processor unit 142 is either a microprocessor or other engine that is capable of executing instructions stored in a memory. The memory 144 can be comprised of a hard disk drive, random access memory ("RAM"), read only memory ("ROM"), a combination of RAM and ROM, or another processor readable storage medium. The memory 144 contains instructions that the processor unit 142 executes to facilitate the performance of the above mentioned process steps. The instructions in the memory 144 are in the form of program code. The program code may conform to any one of a number of different programming languages. For example, the program code can be written in C+, C++, BASIC, Pascal, or a number of other languages.

The display unit 149 provides information to a chamber operator in the form of graphical displays and alphanumeric characters under control of the processor unit 142. The input control unit 148 couples a data input device, such as a keyboard, mouse, or light pen, to the control unit 140 to provide for the receipt of input from an operator or from the computer system operating a complex processing tool.

The control unit bus 150 provides for the transfer of data and control signals between all of the devices that are coupled thereto. Although the control unit bus 150 is displayed as a single bus that directly connects the devices in the control unit 140, the control unit bus 150 can also be a collection of busses. For example, the display unit 149, the input control unit 148, and mass storage device 146 may be coupled to an input-output peripheral bus, while the processor unit 142 and memory 144 are coupled to a local processor bus. The local processor bus and input-output peripheral bus are coupled together to form the control unit bus 150.

The control unit 140 is coupled to the chamber 100 via a plurality of elements of the deposition system, employed in depositing material on wafers being individually passed through the chamber and in accordance with the present invention. The elements include, but are not limited to the heater electrode 222 and the cooling manifold\electrode 234 for controlling temperature, and the chucking electrodes 224 and dc power supply 122 for controlling biasing of the wafer 102. Each of the elements is coupled to the control unit bus 150 to facilitate communication between the control unit 140 and the elements. The control unit 140 provides signals to the chamber elements that cause the elements to perform the operations required for the process steps described above. In operation, the processor unit 142 directs the operation of the chamber elements in response to the program code instructions that it retrieves from the memory unit 144. In response to these instructions, the chamber elements are directed to perform the process steps described above.

Thus, the inventive process allows for the bonding of solder bumps to the bonding pads on a semiconductor wafer. Specifically, the titanium adhesive and nickel vanadium barrier film layers are deposited on the wafer at a low temperature and high RF bias level of the electrostatic chuck. In this manner, the stress levels of the film layers may be controlled, and thereby reduce the flip chip's susceptibility to solder joint failures.

Although various embodiments that incorporate the teachings of the present invention have been shown and described in detail herein, those skilled in the art can readily devise many other varied embodiments that still incorporate these teachings.

What is claimed is:

1. A method of forming solder bumps on a semiconductor wafer comprising the steps of:
    providing at least one bond pad on the semiconductor wafer;
    forming a barrier layer over said at least one bond pad; and
    forming said solder bumps upon said barrier layer wherein the barrier layer has a low tensile or compressive stress.

2. The method of claim 1 further comprising the steps of sputtering said semiconductor wafer with an adhesive layer over said at least one bond pad and prior to said forming said barrier layer.

3. The method of claim 1 further comprising the steps of reflowing said solder to form a solder bump upon said bond pad.

4. The method of claim 2 further comprising the steps of:
    depositing a layer of silicon nitride over said at least one bond pad;
    depositing a polyimide layer over said silicon nitride layer;
    etching at least one channel through said silicon nitride and polyimide layers to expose said at least one bond pad; and
    depositing said adhesive layer on said exposed at least one bond pad and within said at least one channel.

5. The method of claim 2 wherein said adhesive layer is titanium.

6. The method of claim 1 wherein said barrier layer is nickel vanadium.

7. The method of claim 1 wherein said forming steps are performed on a low temperature biasable electrostatic chuck.

8. The method of claim 7 wherein said temperature and biasing of said electrostatic chuck are selected to achieve said low tensile or compressive strength film.

9. The method of claim 8 wherein the temperature of said electrostatic chuck is in the range of 25 degrees Celsius to 200 degrees Celsius.

10. The method of claim 8 wherein the biasing power of said electrostatic chuck is in the range of 50 Watts to 800 Watts.

11. A method of forming solder bumps on a semiconductor wafer in a semiconductor wafer process chamber having an electrostatic chuck, comprising the steps of:
    selecting an operating temperature of said electrostatic chuck in the range of 25 degrees Celsius to 200 degrees Celsius;
    selecting an operating bias power of said electrostatic chuck in the range of 50 Watts to 800 Watts;
    sputtering said semiconductor wafer with a barrier deposition material to form a layer over at least one solder pad of said semiconductor wafer; and
    depositing solder on said barrier layer.

12. The method of claim 11 further comprising the step of sputtering said semiconductor wafer with an adhesive layer prior to said sputtering step of said barrier layer.

13. The method of claim 11 further comprising the step of reflowing said solder to form a solder bump upon said barrier layer.

14. The method of claim 12 further comprising the steps of:
    depositing a layer of silicon nitride over said at least one bond pad;
    depositing a polyimide over said silicon nitride layer;
    etching at least one channel through said silicon nitride and polyimide layers to expose said at least one bond pad; and
    depositing said adhesive layer on said exposed at least one bond pad and within said at least one channel.

15. The method of claim 12 wherein said adhesive layer is titanium.

16. The method of claim 11 wherein said barrier layer is nickel vanadium.

17. The method of claim 11 wherein the temperature of said electrostatic chuck is in the range of 50 degrees Celsius to 100 degrees Celsius.

18. The method of claim 11 wherein the biasing power of said electrostatic chuck is in the range of 300 Watts to 400 Watts.

19. In a system for controlling the process sequence of wafers through a chamber having a low temperature biasable electrostatic chuck, a computer readable medium in a general purpose computer system that operates a special purpose controller when executing a deposition program for said chamber to perform a process comprising the steps of:
    selecting an operating temperature of said electrostatic chuck in the range of 25 degrees Celsius to 200 degrees Celsius;
    selecting an operating bias power of said electrostatic chuck in the range of 50 Watts to 800 Watts;

sputtering said semiconductor wafer with a barrier deposition material to form a layer over at least one solder pad of said semiconductor wafer; and depositing solder on said barrier layer.

20. The method of claim 19 further comprising the step of sputtering said semiconductor wafer with an adhesive layer prior to said sputtering step of said barrier layer.

21. The method of claim 19 further comprising the step of reflowing said solder to form a solder bump upon said barrier layer.

22. The method of claim 20 further comprising the steps of:

depositing a layer of silicon nitride over said at least one bond pad;

depositing a polyimide over said silicon nitride layer;

etching at least one channel through said silicon nitride and polyimide layers to expose said at least one bond pad; and depositing said adhesive layer on said exposed at least one bond pad and within said at least one channel.

23. The method of claim 19 wherein the temperature of said electrostatic chuck is in the range of 50 degrees Celsius to 100 degrees Celsius.

24. The method of claim 19 wherein the biasing power of said electrostatic chuck is in the range of 300 Watts to 400 Watts.

25. The method of claim 8 wherein the operating bias power of said electrostatic chuck is in the range of 50 Watts to 800 Watts.

* * * * *